United States Patent
Crell

(10) Patent No.: US 6,841,316 B2
(45) Date of Patent: Jan. 11, 2005

(54) METHOD FOR PRODUCING A PHASE SHIFT MASK

(75) Inventor: Christian Crell, Forstinning (DE)

(73) Assignee: Infineon Technologies AG, Munich (DE)

( * ) Notice: Subject to any disclaimer, the term of this patent is extended or adjusted under 35 U.S.C. 154(b) by 218 days.

(21) Appl. No.: 10/185,281

(22) Filed: Jun. 27, 2002

(65) Prior Publication Data

US 2003/0003376 A1 Jan. 2, 2003

(30) Foreign Application Priority Data

Jun. 27, 2001 (DE) .......................................... 101 31 012

(51) Int. Cl.[7] .............................. G03C 5/00; G03F 9/00
(52) U.S. Cl. .......................................... 430/5; 430/296
(58) Field of Search ............................ 430/5, 296, 322, 430/323, 324

(56) References Cited

U.S. PATENT DOCUMENTS 5,482,799 A * 1/1996 Isao et al. ...................... 430/5

FOREIGN PATENT DOCUMENTS

| DE | 44 35 773 A1 | 4/1995 |
|----|----|----|
| EP | 0 773 477 A1 | 5/1997 |
| EP | 0773477 | * 5/1997 |

* cited by examiner

*Primary Examiner*—Saleha R. Mohamedulla
(74) *Attorney, Agent, or Firm*—Laurence A. Greenberg; Werner H. Stemer; Ralph E. Locher

(57) ABSTRACT

To avoid charging effects of isolated chromium structures during the structuring of a second level of attenuated phase shift masks, a previous chromium etching step is preferably carried out in a time-controlled manner, so that a residual chromium layer, which is approximately 5–20 nm thick, remains at the bottom of the columns. The residual chromium layer connects the chromium webs, which are otherwise isolated, in a conductive manner and therefore dissipates the charge to the outside during the subsequent structuring by an electron beam. In the process steps that follow the exposure of the second level—preferably of alternating attenuated phase shift masks—two further chromium etching steps can be carried out, with a small etching depth in each case in the columns provided for the quartz etching of different phase shift.

12 Claims, 2 Drawing Sheets

METHOD FOR PRODUCING A PHASE SHIFT MASK

BACKGROUND OF THE INVENTION

Field of the Invention

The present invention relates to a method for producing a phase shift mask.

To transfer structures with a resolution of as little as a few tens of nanometers to silicon wafers or similar semiconductor products, it is customary to use masks, on which the structure which is to be transferred is present in binary form, for example linear regions covered by opaque chromium on an otherwise transparent substrate material, generally quartz. In the case of a projection carried out with optical wavelengths, the masks are transilluminated and the structures are transferred in an identical or reducing image, via a lens system, to the light-sensitive layer of a wafer. However, for future mask technologies, images produced via reflection on the mask surface will also be considered.

The trend toward increasingly small feature sizes on the wafer imposes constantly increasing demands on the technology of the mask or the reticle for reducing projection, the projection system with any lens aberration which may be present, the illumination techniques used, and/or the numeric aperture. Specifically, suitable techniques in this context have a positive effect on the coefficient in an otherwise linear relationship between the feature size which can be resolved and a projection wavelength employed.

With masks, it is attempted to achieve this by the use of attenuated phase shift masks. In this case, the relevant structure contrast is significantly increased by interference effects as a result of the introduction of a phase contrast, for example at structural edges. A range of types of attenuated phase shift masks that differ with regard to the way in which the phase shift is applied and the formation of the structures, are known.

In the case of what are known as attenuated phase shift masks (also known as embedded phase shift masks), on the transparent substrate material, at the location of the lines which are to be structured, there are semitransparent webs of a phase-shifting material, e.g. molybdenum-silicon, instead of the chromium webs which are present in conventional chromium-on-glass (COG) masks. The thickness of such regions is selected in such a manner that a phase shift through approximately 180° is achieved in order to eliminate the contributions of light from adjacent regions at the edges. To produce attenuated phase shift masks of this type, in a first step, also known as the first level, a chromium layer which initially lies on the quartz blank and the phase-shifting layer (e.g. Mo—Si), is cleared away at those locations at which the phase-shifting material below it is also to be etched away. In a further step, the second level, the remaining chromium layer is then removed, so that the structure below it is imaged in the remaining semitransparent, phase-shifting material. Depending on the projection light wavelength, coated blanks that transmit 4–8% of the light in the phase-shifting layer are usually supplied.

While in the chip region the chromium covering is substantially removed in the case of the attenuated phase shift masks, in the case of tri-tone phase shift masks chromium surfaces are additionally used for forming structures in the chip. Furthermore, there are also what are known as multilevel phase shift masks with a greater number of structured levels.

Chromium regions for forming structures on the mask are also left in the alternating phase shift masks (also known as Levenson type masks). The phase shift is in this case achieved by etching the substrate material, typically quartz, with which the transparent regions that lie between the chromium layers are alternately processed. Therefore, alternating phase shift masks are particularly suitable for structuring problems with dense, grid-like structures that lie close to the resolution limit.

The chromium-free phase shift masks as an independent type make use of the fact that at the edge between two transparent regions with different phase shift—in particular 180°—destructive interference with a high intensity contrast compared to the surrounding regions can be achieved. Therefore, by structure edge etching very close together, it is even possible to produce structures that are above the resolution limit without internal transparency.

What are known as rim masks, in which a contrast-increasing rim of this type is laid around chromium structures, represent a further form.

The use of phase shift masks is in the field of high-quality, high-resolution masks, the quality of which justifies the additional outlay involved in production, i.e. the structuring of at least two levels, the generally expensive raw material and the more accurate process engineering. Therefore, the electron beam writing units, which are currently experiencing tremendous progress in the field of lithographic exposure techniques, are increasingly being used for the exposure of phase shift masks, in particular the alternating phase shift masks for the imaging of minimal feature sizes onto a wafer.

In the case of alternating phase masks, given ever tighter specified tolerances, laser exposure devices will in future scarcely be used, in particular for the structuring of the second levels; of course, this will also apply to the first level. In the case of alternating phase shift masks, in the first level the nontransparent regions, i.e. the chromium webs, are defined, while in the second level the transparent regions which are to be provided with a phase shift in an etching step are removed from the transparent regions by laser or electron beam lithography.

A structuring order of this type leads to individual chromium webs remaining in position in isolated form on the substrate material in the first level. Therefore, during the exposure of the narrow intervening regions in the second level by an electron beam, charging effects occur in the isolated chromium structures, since the charge cannot flow out of them in time. Therefore, the electron beam may disadvantageously be diverted or widened a few nanometers in the vicinity of the charged chromium structures, and in the case of positional accuracy and structure width tolerances of approximately 10 nm or below, this may lead to failure of the mask. Furthermore, it is possible that electrostatic discharges (ESDs) may lead to the destruction of the circuit structure. While this situation does not arise in the case of masks with relatively low demands on the specification tolerances on account of the laser lithography processes used therefor, for phase shift masks with structure width and positional accuracy tolerances which are close to the resolution limit there are two similar methods with which it is attempted to solve the problem with electron beam lithography. In both cases, the resist for the second level is applied, after which in the first case a metal is vapor-deposited and in the second case a conductive polymer is applied. Both layers are used to remove the charges on the mask surface that have been applied by the electron beam.

However, these methods have the considerable drawback that, particularly on account of particle generation, the defect problems are increased and, secondly, the structure integrity is adversely affected.

SUMMARY OF THE INVENTION

It is accordingly an object of the invention to provide a method for producing a phase shift mask that overcomes the above-mentioned disadvantages of the prior art methods of this general type, in which the diversion of beams of charged particles, e.g. electron beams for exposing charge-sensitive layers on the mask, on account of charging effects at insulated structures on the mask substrate material is to be avoided.

With the foregoing and other objects in view there is provided, in accordance with the invention, a method for producing a phase shift mask having structures. The method includes providing a substrate having a transparent substrate material layer, a chromium layer with a given thickness coating the transparent substrate material layer, and a further layer disposed on the chromium layer. The further layer is either a photosensitive layer or a charge-sensitive layer. The further layer is structured using a beam of laser light or charged particles resulting in a first structure. The first structure is transferred to the chromium layer by performing a first etching step resulting in etched-in structures each having a first depth and a remainder of the chromium layer disposed below each of the etched-in structures has a reduced thickness. A further charge-sensitive layer is applied on the chromium layer. The further charge-sensitive layer is structured using a further beam of charged particles resulting in a second structure. The second structure is transferred down into the transparent substrate material layer by performing a second etching step.

The present invention relates above all to an application in the field of alternating phase shift masks. An application in attenuated phase shift masks or tri-tone phase shift masks or, in general, in phase shift masks with isolated structures of a conductive material on a non-conductive substrate material is also possible. In particular, instead of chromium or a chromium layer it is also possible for molybdenum-silicon in combination with a chromium layer or equivalent materials to be treated in accordance with the invention.

In accordance with the inventive method, after the structuring of the first level in the photosensitive or charge-sensitive layer—depending on whether a laser beam, an electron beam or an ion beam exposure is to be carried out—it is not, as is customary, an etching process with end point identification for example resulting from spectrophotometry-excited chromium states or from changed reflection characteristics of a directed laser beam which is employed, but rather the chromium etching step is interrupted before it breaks through to the material below, for example quartz. The premature interruption to the etching step is caused by a thin film of the chromium layer being left between the chromium regions which may otherwise be isolated.

Therefore, as a result of the premature interruption to the first chromium etching step, there is at least a thin film of chromium over the entire surface of the substrate material, so that at the start of the structuring of the second level, i.e. the second exposure using a beam of charged particles—in particular an electron beam—there is a continuous thin film, which is capable of transporting charges, present below the charge-sensitive layer. As has been mentioned in the introduction, the thin film may be formed of chromium, but may also be formed of molybdenum-silicon, etc. Therefore, a cumulative charging effect only occurs to a reduced extent or does not occur at all, and the beam of charged particles is not diverted or widened.

According to the invention, a suitable beam of charged particles is not only an electron beam but also modern ion beam technologies. In the claims, the exposure method by an electron or ion beam is referred to as structuring of the first or second level. According to the invention, the first level may also have been structured by a laser beam or other exposure techniques. The charge-sensitive layer denotes any layer that can be activated or chemically converted in a location-dependent manner by charged particles, in order, if appropriate after exposure and subsequent selective removal to form a resist mask, to be used for a subsequent etching process.

A particular advantage of the present invention results from the fact that there is no need to carry out an additional deposition, exposure or novel etching process in order to carry out the method according to the invention. There is merely a need for two short additional chromium etching processes, as will be described in more detail in further aspects.

In a further configuration of the invention, the first chromium etching depth is fixed by a predefined first etching time. This measure ensures that, in a substantially reproducible method, a substantially constant thickness of the chromium layer is always left in the regions that are to be structured. According to a further configuration, the thickness is preferably between 5 and 20 nanometers. Starting from an initial chromium layer thickness of 100 nanometers—future high-specification mask blanks are anticipated to have thicknesses of only 70 nanometers—it is even now possible to achieve an accuracy of this level given a predetermined time and a constant etching rate.

The time control is preferably determined and defined experimentally in advance. It is substantially determined from the abovementioned initial chromium thickness and the etching rate. The homogeneity and isotropy or anisotropy of the etching process using a mask must also be taken into account. Criteria for the chromium thickness of the remaining layer in the structured region which can be achieved and have sufficient conductivity, which must be matched to the intensity and diameter of the electron or ion beam, and the optical transparency in order for it to be possible to carry out metrology and defect inspections between individual process steps, in particular between the planar exposures. This ensures that any repairs to the structures can be carried out, for example the application of chromium.

In the case of high-quality etching equipment which is currently in use, the accuracy for the formation of a residual chromium thickness during time-controlled etching is approximately 5 nanometers.

In a further configuration of the present invention, after structuring of the second level, i.e. a second exposure by electron or ion beam, a chromium etching step is carried out, which etches away the remaining, reduced chromium layer in the structured regions of the second level. In a further configuration, which preferably relates to alternating phase shift masks, the etching step is also carried out in a time-controlled manner, in order advantageously not to obtain any unreliable signals as a result of the chromium edges of the solid, initial chromium thickness which in this case project within the structure holes in the resist layer which is still present. When the same etching process as in the first etching step is used, the duration of the second chromium etching will be substantially proportional to the first duration.

In a further configuration, after completion of the structuring of the second level, the subsequent second chromium etching step, a subsequent quartz etching and the removal of the charge-sensitive layer, chromium is removed from the entire surface, with the thickness removed precisely corresponding to the residual chromium thickness. As a result, in the trenches which exist between the chromium webs, the removal of material breaks through to the substrate material, for example the quartz, while the opaque nature of the chromium webs or surfaces does not change, on account of the small amount of chromium which is removed, preferably 5–20 nm. If the initial chromium thickness was 100 nm, at least 80 nm chromium thickness would then still remain in the chromium areas.

Therefore, after a third chromium etching step has been carried out, with the exception of the negligible lowering of the chromium thickness in the chromium areas, there is advantageously no difference from conventional production in particular of alternating phase shift masks. In contrast, the process sequence has the advantage that, since the charging of isolated chromium regions is prevented, diversion of the charged particle beam is avoided and therefore higher accuracy is achieved during structuring of the masks.

After the first etching step, an inspection of the etched-in structures that are defined by the remaining chromium thickness is performed using an optical microscope and/or a simple defect inspection.

The phase shift mask formed according to the invention can be an alternating phase shift mask, an attenuated phase shift mask, or a tri-tone phase shift mask.

Other features which are considered as characteristic for the invention are set forth in the appended claims.

Although the invention is illustrated and described herein as embodied in a method for producing a phase shift mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
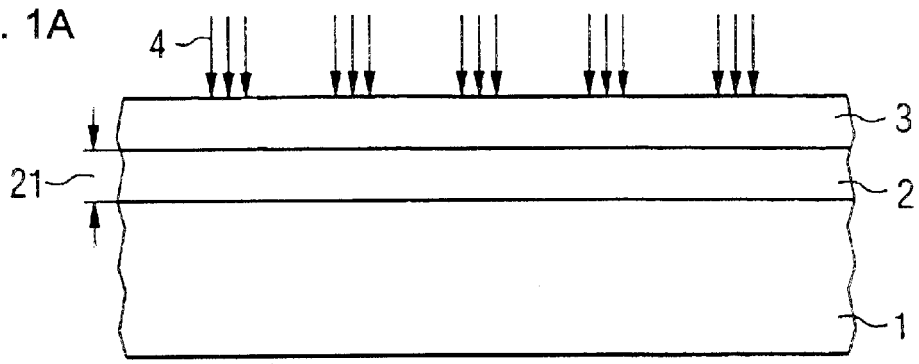
FIGS. 1A–1D are diagrammatic, sectional views through an alternating phase shift mask showing a sequence of process steps according to the invention, including, an exposing step at a first level (FIG. 1A), a first chromium etching step with a residual chromium thickness (FIG. 1B), an application of a resist and an exposure at a second level step (FIG. 1C), and a developing step at the second level (FIG. 1D)
Figure 1B:
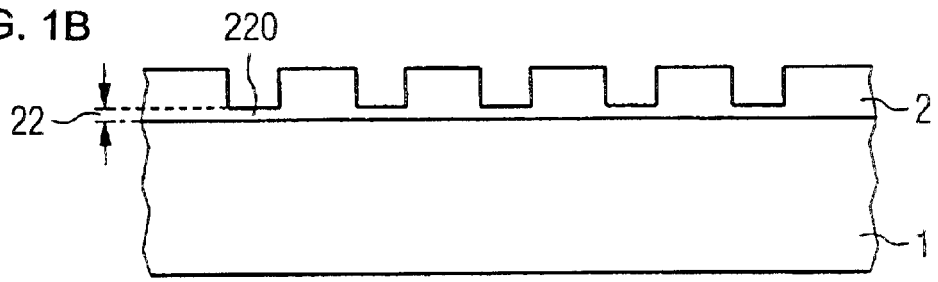

Referring now to the figures of the drawing in detail and first, particularly, to FIGS. 1A–1D thereof, there are shown process steps of an inventive production process for alternating phase shift masks through to exposure and development of a second level. A quartz blank is provided as a transparent substrate material 1. The substrate material 1 is coated with a chromium layer 2 of an initial chromium thickness 21 and a charge-sensitive resist layer 3 above it. The transparent substrate material 1 is exposed by an electron beam 4 that has a row and column structure. After a developing step, a first chromium etching step is carried out, during which, after a predetermined, defined duration, the etching operation is terminated. The duration was determined experimentally for the plasma etching unit used in the present example and blanks with an initial chromium thickness 21 of 100 nm, in such a manner that, after the first chromium etching step, there is a residual chromium thickness 22 of 10 nm on the quartz material 1 in the etched-in columns (FIG. 1B).

Figure 1C:
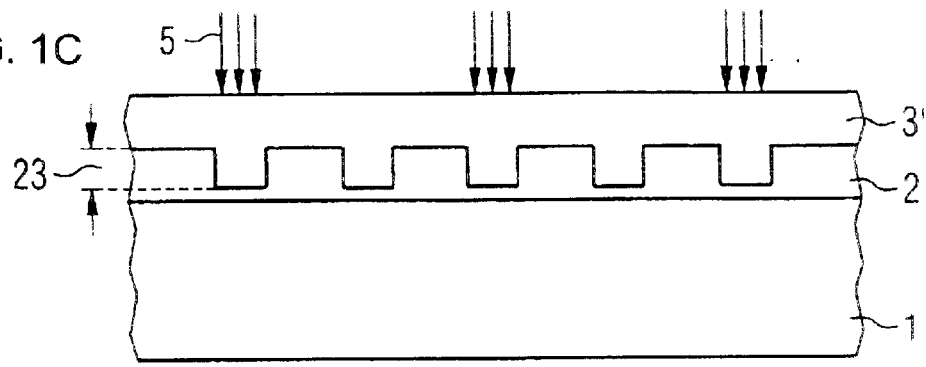

The mask is then covered again with a charge-sensitive resist layer 3' and is exposed by an electron beam 5 in the columns in which a phase shift is subsequently to be implemented by quartz etching (FIG. 1C). The residual chromium layer 220 which is present at the bottom of the columns and remained in place after the first chromium etching step with a chromium etching depth 23, and which conductively connects the unexposed chromium webs which have remained in place, prevents the electron beam from being diverted by charged, isolated chromium structures.

Figure 1D:
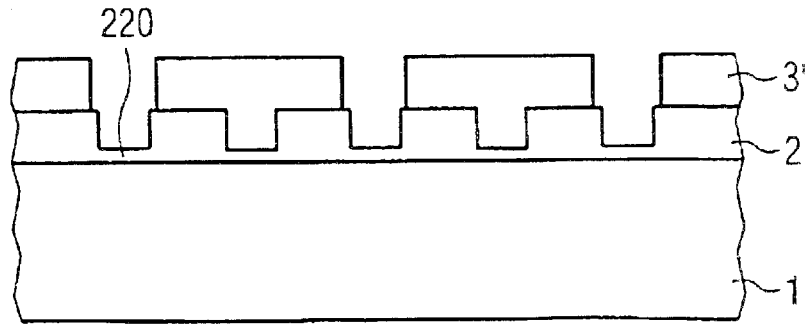

After an exposure of a second level, a further development step is carried out, so that the columns that have been selected for the quartz etching are uncovered (FIG. 1D).

For the remainder of the process, the steps that are shown by way of example in FIGS. 2A–2D can be carried out. To eliminate the residual chromium layer 220 at the bottom of the columns which have been uncovered for the quartz etching, a second chromium etching step is carried out which, for example in a time-controlled manner, etches away precisely the residual chromium thickness 22 of 10 nm, with the chromium edges which after exposure of the second level project into the columns also being etched away by 10 nm in the anisotropic plasma etching step to form a small chromium step 221, as can be seen from FIG. 2A.

Figure 2A:
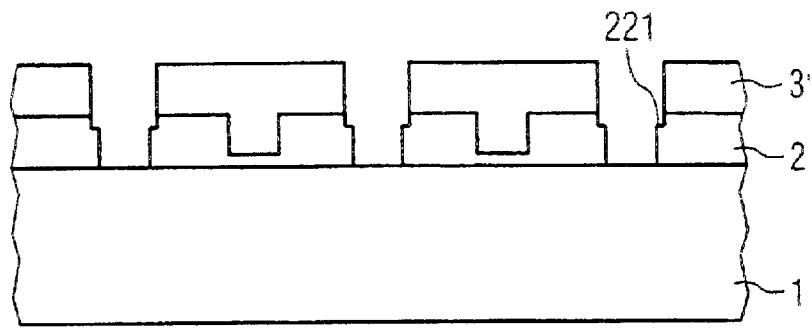
FIGS. 2A–2D are diagrammatic, sectional views of the alternating phase shift mask during further process steps, including a second chromium etching step (FIG. 2A), a quartz etching step (FIG. 2C), a resist removal step (FIG. 2C), and a surface wide chromium etching step (FIG. 2D).
Figure 2B:
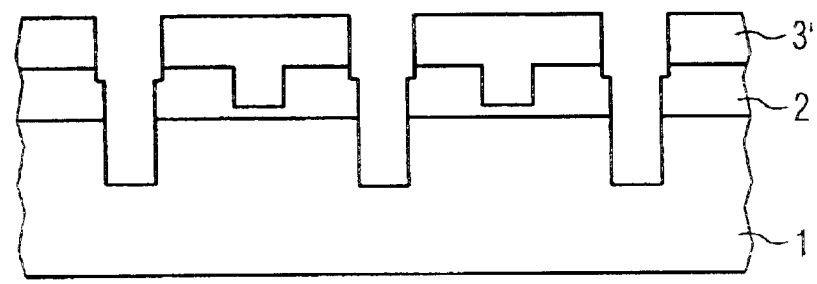
Figure 2C:
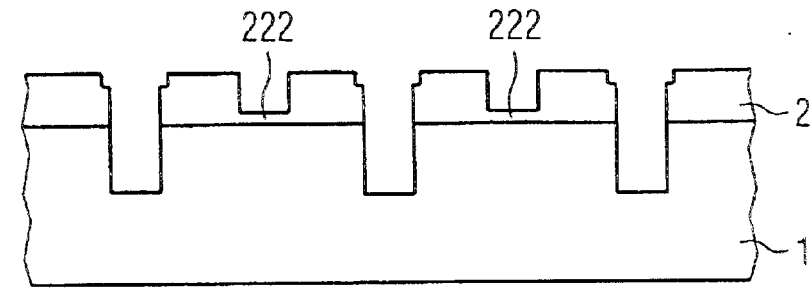
Figure 2D:
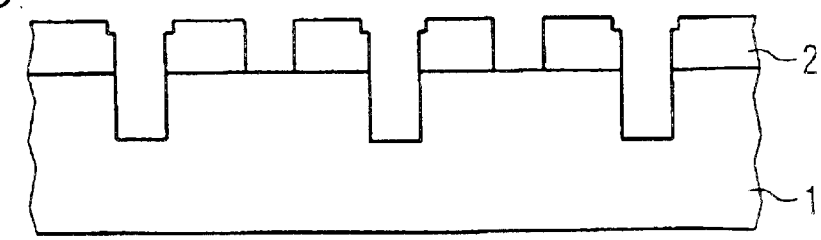

Then, the quartz etching step is carried out (FIG. 2B). After the charge-sensitive resist layer 3' (FIG. 2C) has been removed, a third chromium etching step is carried out, which is present for removal of the residual chromium layer 222 in the columns which have now been uncovered and have not been quartz-etched. The chromium etching depth of 10 nm therefore approximately corresponds to the duration of the second chromium etching step. This step is carried out over the entire surface, i.e. 10 nm is removed from all the current structures, but this has no significant consequences for the opaque property of the chromium webs. Ultimately, the chromium webs have a height of 90 nm, and the chromium steps 221 which face from these webs toward the quartz-etched columns, have a height of 80 nm (FIG. 2D).

Between the process steps, in particular between the two level exposures in accordance with FIGS. 1A and 1C, inspection steps are repeatedly carried out, i.e. metrology steps for measuring feature sizes and/or the positional accuracy, as well as various types of defect inspections, including using SEM or AFM. If appropriate, repairs are also carried out. The inspections are possible since in the opposite light that is incident through the quartz blank the residual chromium thickness 22 is thin enough to transmit the light and the contrast between the highly reflective, thin chromium and the reflection-reducing layer that has remained on the unetched chromium is high enough.

After the third chromium etching step, as in conventional production by the dual-trench process, the contributions of light intensities in the quartz trenches and the trenches or columns which have not previously had a phase shift can be adjusted. This may involve further quartz etching steps. This is usually followed by inspections, any repairs that may be necessary and pellicle mounting.

I claim:

1. A method for producing a phase shift mask having structures, which comprises the steps of:

providing a substrate having a transparent substrate material layer, a chromium layer with a given thickness coating the transparent substrate material layer, and a further layer disposed on the chromium layer, the further layer selected from the group consisting of a photosensitive layer and a charge-sensitive layer forming a resist mask after treatment or application with charged particles;

structuring the further layer using a beam of one of laser light and charged particles resulting in a first structure;

transferring the first structure to the chromium layer by performing a first etching step resulting in etched-in structures each having a first depth and a remainder of the chromium layer disposed below each of the etched-in structures having a reduced thickness;

applying a further charge-sensitive layer on the chromium layer;

structuring the further charge-sensitive layer using a further beam of charged particles resulting in a second structure; and transferring the second structure down into the transparent substrate material layer by performing a second etching step.

2. The method according to claim 1, which comprises after the structuring of the further charge-sensitive layer step but before the second etching step, transferring the second structure to the chromium layer by performing a further etching step down to a second depth corresponding to the reduced thickness of the chromium layer which remains after the first etching step.

3. The method according to claim 2, which comprises:

removing the further charge sensitive layer; and performing a third etching step on the remainder of the chromium layer remaining in at least one of the etched-in structures covered by the further charge-sensitive layer down to a third depth.

4. The method according to claim 3, which comprises carrying out the third etching step of the chromium layer over an entire surface of the phase shift mask.

5. The method according to claim 1, which comprises carrying out the structuring of the further charge-sensitive layer using an electron beam.

6. The method according to claim 1, which comprises setting a range of the reduced thickness of the remainder of the chromium layer below the etched-in structures which remain after the first etching step to be between 5 and 20 nanometers.

7. The method according to claim 1, which comprises fixing the first depth in the first etching step by setting a fixed, etching duration that cannot be altered after the first etching step has commenced.

8. The method according to claim 2, which comprises fixing the second depth in the further etching step by setting a fixed etching duration which cannot be altered after the further etching step has commenced.

9. The method according to claim 3, which comprises fixing the third depth in the third etching step by setting a fixed etching time which cannot be altered after the third etching step has commenced.

10. The method according to claim 1, which comprises carrying out, after the first etching step, an inspection of the etched-in structures which are defined by the remaining chromium thickness using an optical microscope.

11. The method according to claim 1, which comprises carrying out, after the first etching step, a defect inspection of the etched-in structures which are defined by the remaining chromium thickness.

12. The method according to claim 1, which comprises forming the phase shift mask as a phase mask selected from the group consisting of an alternating phase shift mask, an attenuated phase shift mask, and a tri-tone phase shift mask.

* * * * *